United States Patent [19]
Ferrell et al.

[11] Patent Number: 5,852,418
[45] Date of Patent: Dec. 22, 1998

[54] NOTCHED-SPECTRUM SWEPT-FREQUENCY GENERATOR AND METHOD THEREFOR

[75] Inventors: Bruce H. Ferrell, Tempe; William C. Woody, Phoenix, both of Ariz.

[73] Assignee: Lockheed Martin Corporation, Goodyear, Ariz.

[21] Appl. No.: 967,840

[22] Filed: Nov. 12, 1997

[51] Int. Cl.$^6$ .................................................. G01S 7/28
[52] U.S. Cl. .......................... 342/202; 342/101; 342/134
[58] Field of Search ............................. 342/202, 21, 101, 342/132, 134, 135

[56] References Cited

U.S. PATENT DOCUMENTS

| | | | |
|---|---|---|---|
| 3,932,818 | 1/1976 | Masak ................................ | 364/724.19 |
| 4,176,351 | 11/1979 | DeVita et al. ......................... | 342/111 |
| 4,287,475 | 9/1981 | Eaton et al. .......................... | 327/552 |
| 4,613,978 | 9/1986 | Kurth et al. ......................... | 375/346 |
| 4,743,910 | 5/1988 | Hill et al. ............................ | 342/159 |
| 4,928,315 | 5/1990 | Jensen et al. ........................ | 455/307 |
| 5,247,303 | 9/1993 | Cornelius et al. ..................... | 342/26 |
| 5,337,056 | 8/1994 | Dax ....................................... | 342/128 |
| 5,424,742 | 6/1995 | Long et al. ............................ | 342/25 |
| 5,546,085 | 8/1996 | Garnaat et al. ....................... | 342/25 |

OTHER PUBLICATIONS

J.R. Klauder, et al., "The Theory and Design of Chirp Radars", Jul. 1960, pp. 745–808, The Bell System Technical Journal, vol. XXXIX, #4.

*Primary Examiner*—John B. Sotomayor
*Attorney, Agent, or Firm*—Meschkow & Gresham, P.L.C.; Lowell W. Gresham; Jordan M. Meschkow

[57] ABSTRACT

A notched-chirp generator (20), utilizing first and second chirp generators (28, 30), a functional conversion element (40), an antichirp generator (42), a summing element (64), and a translation element (66), generates a notched-chirp signal (24). The second chirp generator (30) generates a second chirp phase signal ($\phi_{C1}$), is translated by the functional conversion element (40) into an oscillating antichirp signal ($A_{O1}$). The antichirp generator (42) generates an antichirp signal ($A_1$) by scaling, weighting, and cyclically positioning the oscillating antichirp signal ($A_{O1}$). The summing element (64) sums the antichirp signal ($A_1$) with a first chirp phase signal ($\phi_{C0}$), generated by the first chirp generator (28), to produce a notched-chirp phase signal ($\phi_N$), which is converted by the translation element (66) into a notched-chirp signal (24) having a notch (26) positioned at a specific frequency ($f_N$) determined by the antichirp signal ($A_1$)

23 Claims, 9 Drawing Sheets

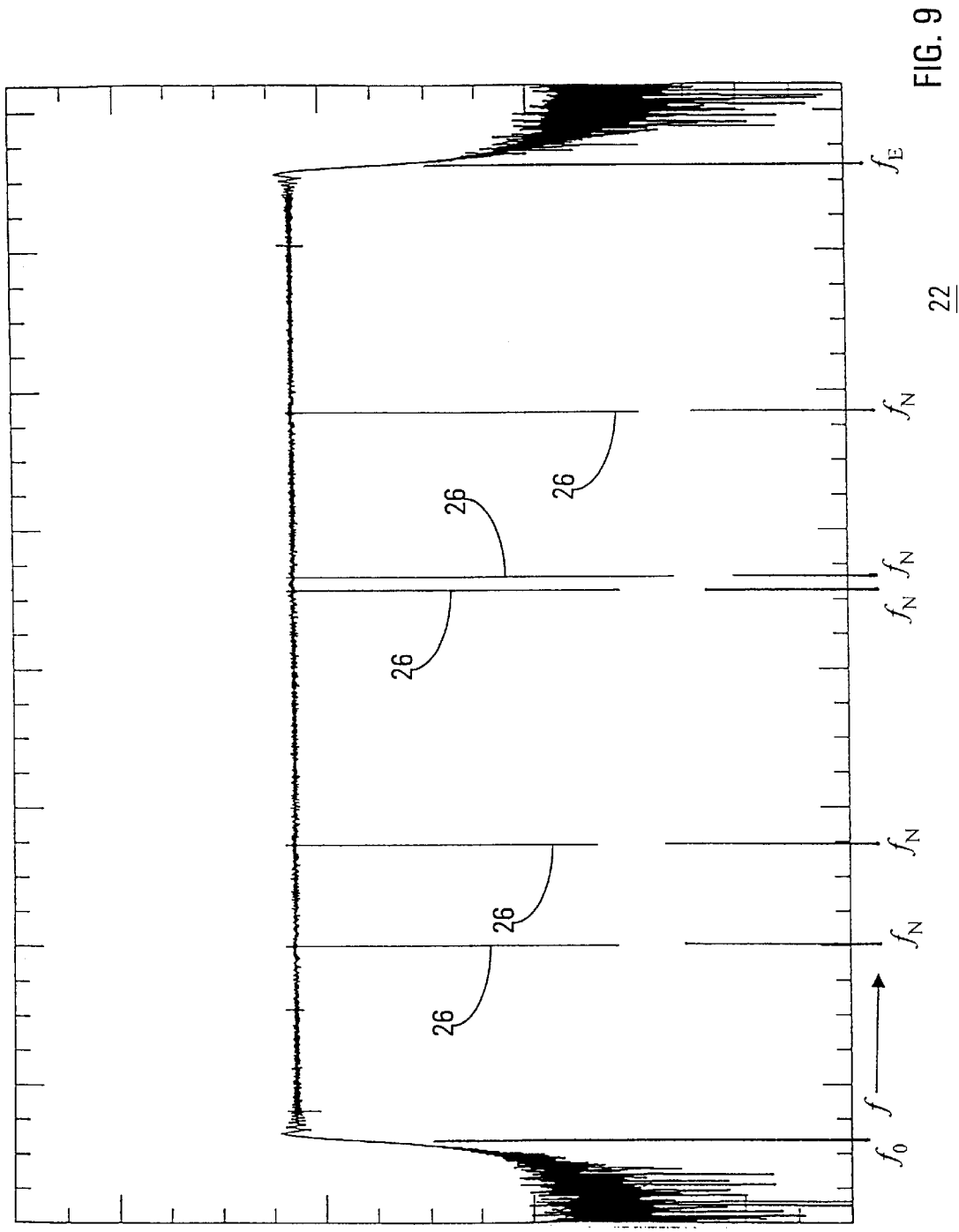

ND-SPECTRUM SWEPT-
FREQUENCY GENERATOR AND METHOD
THEREFOR

TECHNICAL FIELD OF THE INVENTION

The present invention relates to the field of swept-frequency systems. More specifically, the present invention relates to the field swept-frequency systems entailing notched spectra.

BACKGROUND OF THE INVENTION

Systems, such as synthetic-aperture radar systems, conventionally utilize swept-frequency signals at high microwave frequencies, typically X-band at 10 GHz or Ku-band at 17 GHz. At such frequencies, there is relatively little risk of interference with existing fixed-frequency signals within the requisite swept-frequency bandwidth.

With low-frequency (VHF and UHF) radar systems, such as foliage and ground penetration radar systems, the coexistence of swept- and fixed-frequency signals used for other applications becomes problematical. At such frequencies the swept-frequency spectrum must be shared with established commercial, navigational, military, governmental, and other signals. A majority of these signals are non-critical and able to accept a certain amount of transient interference, e.g. an interference of a few "blips" from a radar overflight is of little consequence in a commercial television signal. However, none of these signals can accept continuous interference, as from a fixed radar site, and even transient interference is unacceptable for critical systems, e.g. emergency and navigation systems.

A common implementation of a swept-frequency signal is a linear FM or "chirp" signal, in which the instantaneous frequency is swept linearly as a function of time. In such a signal, the phase varies quadratically as a function of time. Such linear FM or chirp signals are commonly used in radar systems where a fine resolution is required.

For example, a low-frequency foliage-penetrating synthetic-aperture radar operating at 350 MHz with a sweep of ±150 MHz has a chirp spectrum from 200 MHz to 500 MHz. In a typical location, this chirp may interfere with four standard critical fixed-frequency systems: emergency locator beacons at 243.0, 255.4, and 406.0 MHz, and an instrument-landing glideslope system at 328.6–335.4 MHz.

To be non-interfering the exemplary 200–500 MHz chirp should be notched at the critical interfered-with frequencies. Assuming, for exemplary purposes, the potentially interfered-with fixed-frequency signals each have bandwidths of 100 KHz, the interfering chirp may not be swept through 242.95–243.05, 255.35–255.45, 328.55–335.45, and 405.95–406.05 MHz.

Utilizing conventional technology, the chirp may be notched through the use of "brute-force" techniques, creating relatively wide-bandwidth notches (e.g. greater than 100 KHz). This greatly degrades the quality of the chirp and decreases the resolution and quality of the radar image.

In addition to their wide bandwidth, such brute-force notches often have significant amounts of ripple. That is, the amplitude of the chirp spectrum surrounding such notches varies widely, further degrading chirp quality, decreasing image resolution, and causing increased image sidelobes.

Deep notches are difficult to obtain using brute-force methods. The depth of such notches is generally proportional to their width. Thus, a choice must be made between wider, deeper notches and narrower, shallower notches.

Attempting to minimize chirp degradation by narrowing a notch will most often result in a notch with insufficient depth. A too-shallow notch does not sufficiently prevent interference. Conversely, widening a notch to increase its depth to an acceptable level will often result in unacceptable degradation of the chirp. A too-degraded chirp significantly degrades the radar resolution and image quality. Specifically, the radar system impulse response suffers a degraded integrated sidelobe ratio (ISLR).

What is needed is a system in which deep, narrow notches may be implemented in a chirp signal, thus effecting the requisite non-interference with critical fixed-frequency signals while maintaining radar resolution and image quality.

SUMMARY OF THE INVENTION

Accordingly, it is an advantage of the present invention that a notched-spectrum swept-frequency generator capable of generating a chirp signal having a spectrum containing deep, narrow notches at specific frequencies is provided.

It is another advantage that deep, narrow notches are generated with negligible ripple in the chirp spectrum amplitude.

Yet another advantage of the present invention is that the depth, width, and position of each notch is fully adjustable.

The above and other advantages of the present invention are carried out in one form by a method for the generation of a notched-chirp signal. This method includes the generation of a chirp phase signal which progresses quadratically over time. This method also includes the generation of an antichirp signal as a function of the chirp phase signal. This method also includes the modulation of the chirp phase signal by the antichirp signal. This method additionally includes the translation of the chirp phase signal into the notched-chirp signal.

The above and other advantages of the present invention are carried out in another form by providing a notched-chirp generator configured to generate a notched-chirp signal. The notched-chirp generator includes a chirp generator configured to generate a chirp phase signal which is a quadratic function of time. The notched-chirp generator includes an antichirp generator configured to generate an antichirp signal having excursions which vary in frequency over time. The notched chirp generator additionally includes a modulating element configured to modulate the chirp phase signal by the antichirp signal to produce a notched-chirp signal.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 9 depicts a frequency spectrum of a notched-chirp signal having multiple notches in accordance with a preferred embodiment of the present invention.

DETAILED DESCRIPTION OF THE PREFERRED EMBODIMENTS

Figure 1:
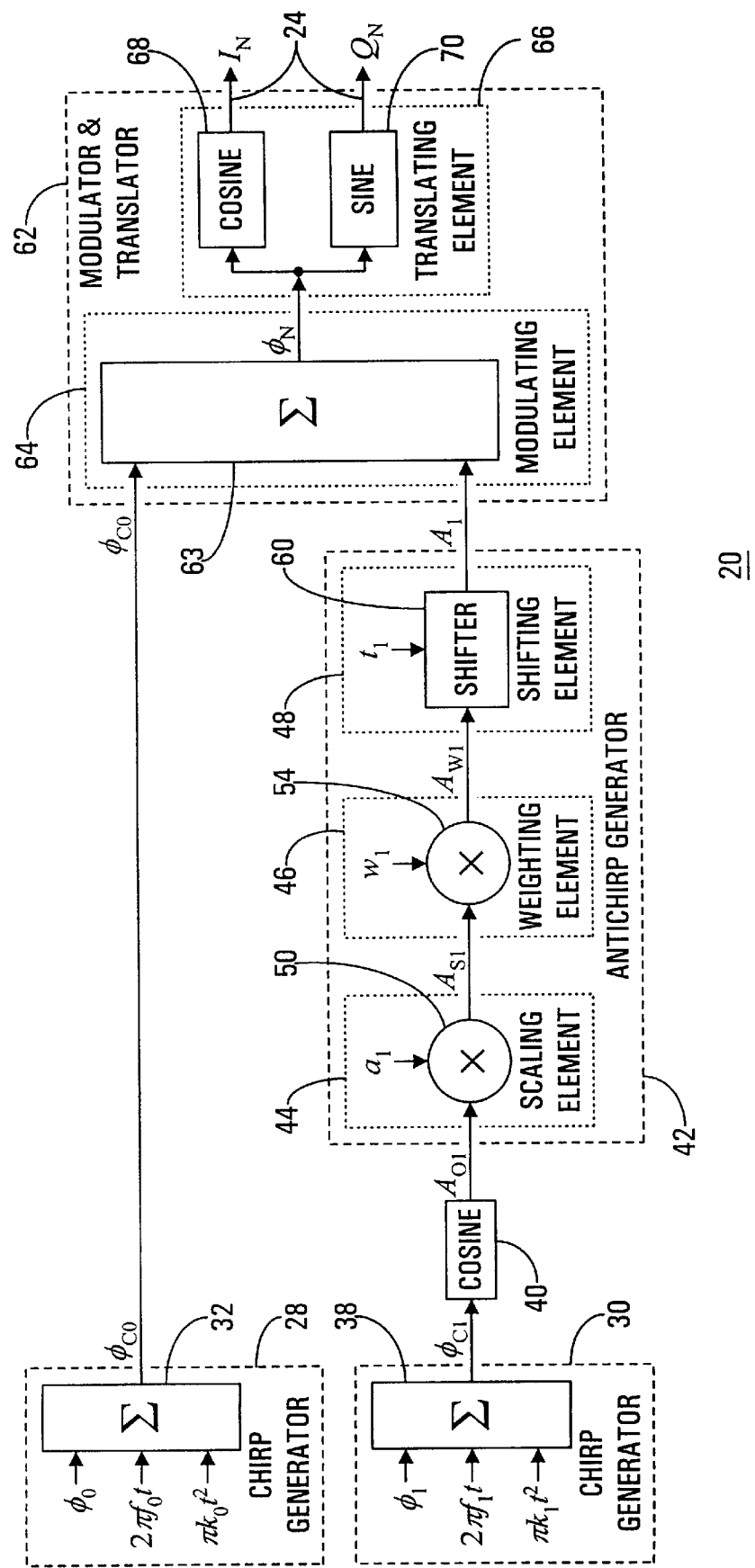
FIG. 1 depicts a block diagram of a notched-chirp generator utilizing an antichirp signal in the phase domain in accordance with a preferred embodiment of the present invention.
Figure 2:
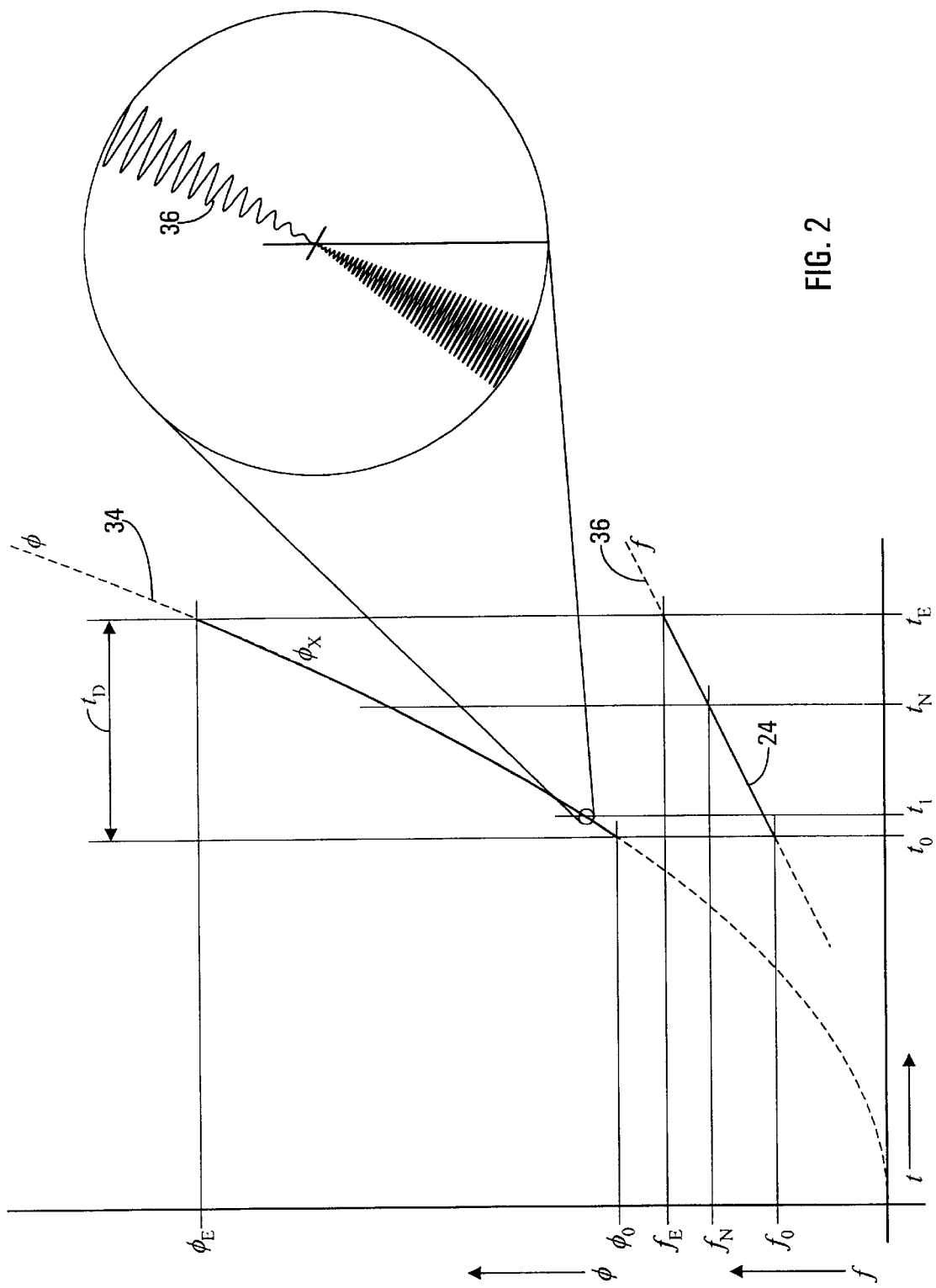
FIG. 2 depicts a diagram illustrating phase and frequency for a notched-chirp phase signal in accordance with a preferred embodiment of the present invention.
Figure 3:
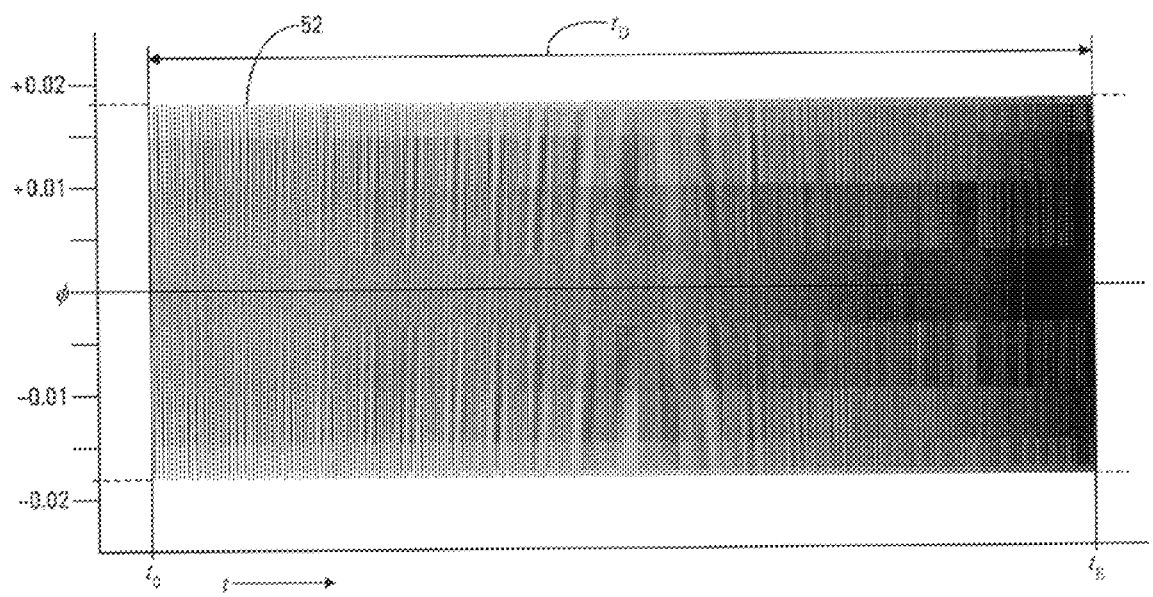
FIG. 3 depicts a scaled antichirp signal, prior to weighting and shifting, in accordance with a preferred embodiment of the present invention.
Figure 4:
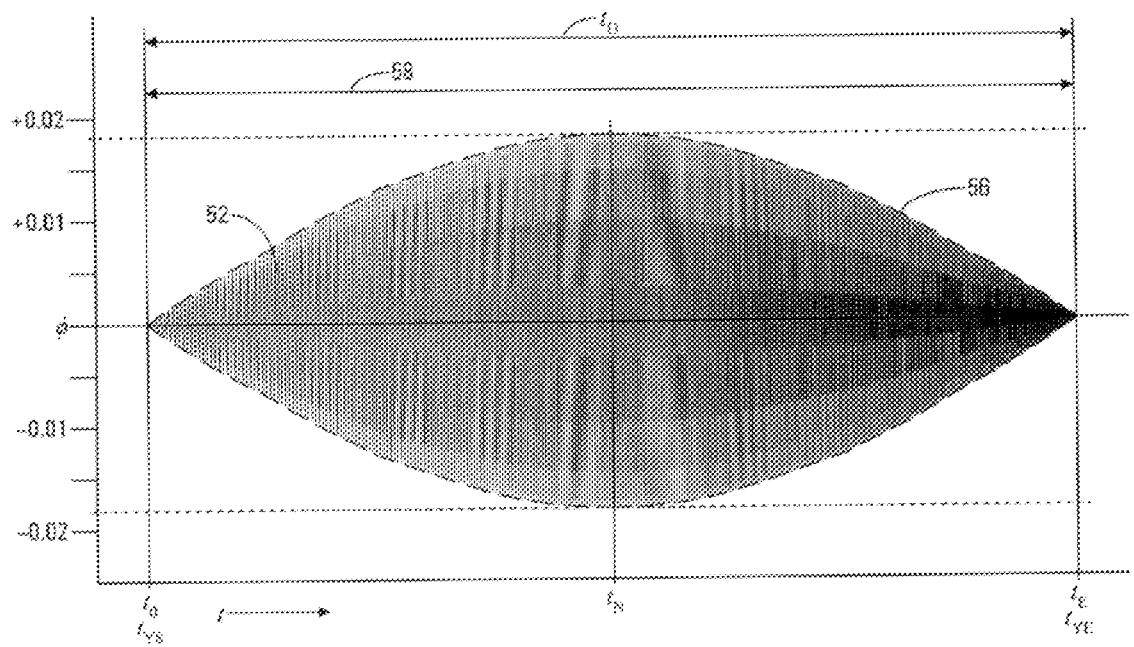
FIG. 4 depicts weighted antichirp signal, prior to shifting, in accordance with a preferred embodiment of the present invention.
Figure 5:
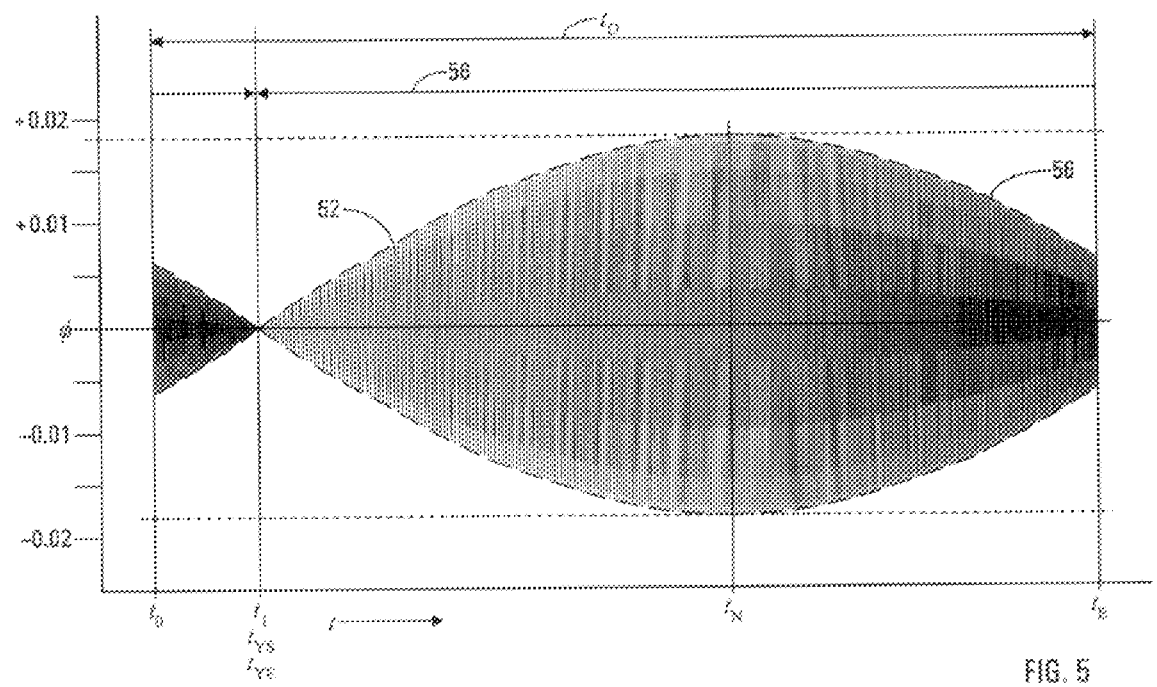
FIG. 5 depicts a scaled, weighted, and shifted antichirp signal in accordance with a preferred embodiment of the present invention.
Figure 6:
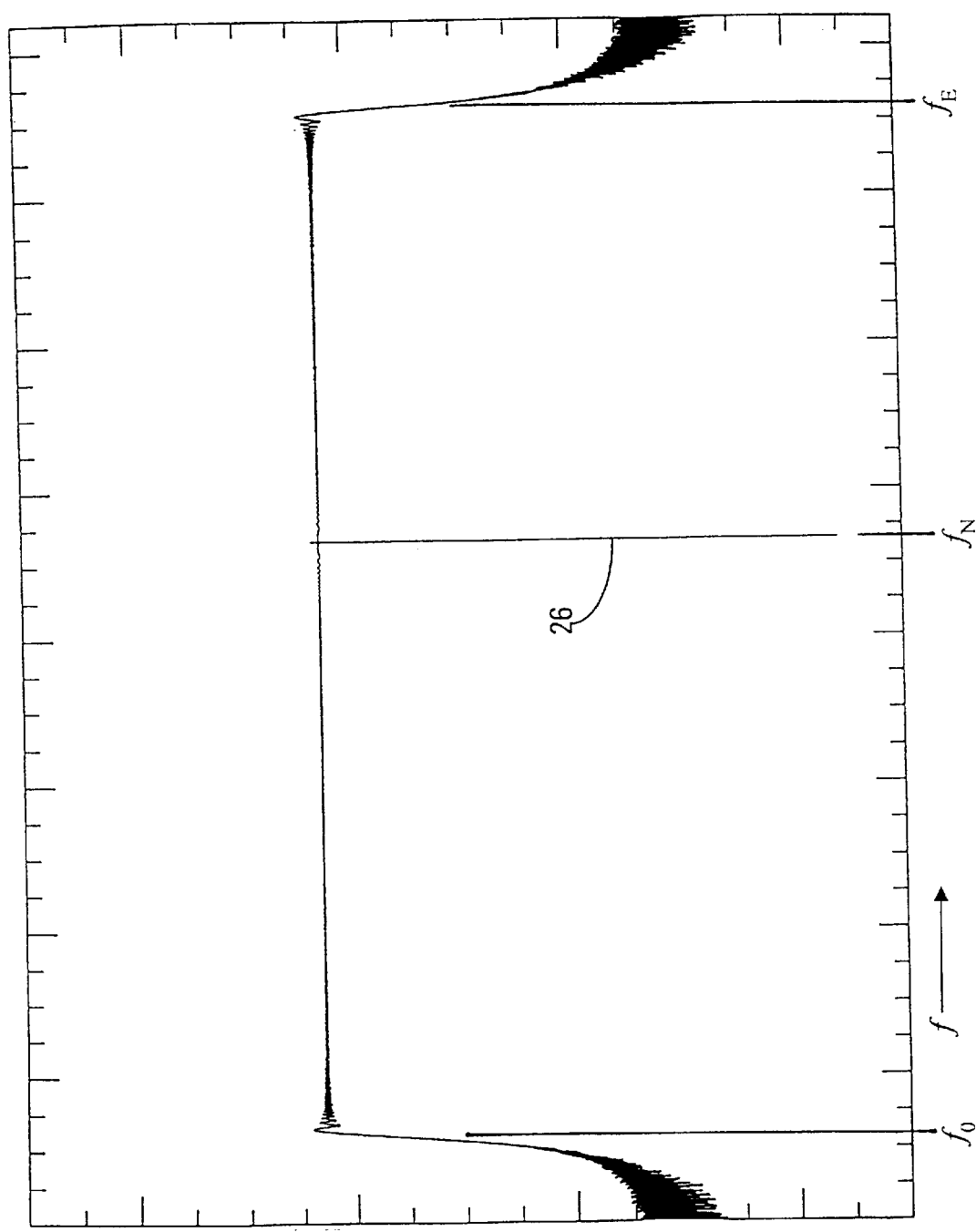
FIG. 6 depicts a frequency spectrum of a notched-chirp signal having a single notch in accordance with a preferred embodiment of the present invention.

In accordance with a preferred embodiment of the present invention, FIG. 1 depicts a block diagram of a notched-chirp generator 20 utilizing an antichirp signal $A_1$ in the phase domain. FIG. 2 depicts a diagram illustrating a phase $\phi$ and a frequency f for a notched-chirp phase signal $\phi_N$. FIG. 3 depicts a scaled antichirp signal $A_{S1}$, prior to weighting. FIG. 4 depicts a weighted antichirp signal $A_{W1}$, prior to shifting. FIG. 5 depicts scaled, weighted, and shifted antichirp signal $A_1$. FIG. 6 depicts a frequency spectrum 22 of a notched-chirp signal 24 having a single notch 26. The following discussion refers to FIGS. 1 and 2, with references to FIGS. 3 through 6 where indicated.

A preferred embodiment is presumed for this discussion wherein notched-chirp signal 24 having only a single notch 26 (FIG. 6) is generated utilizing antichirp signal $A_1$ in the phase domain. Another embodiment utilizing antichirp signal $A_1$ in the amplitude domain is discussed below in connection with FIG. 7. Yet another embodiment having multiple notches 26 is discussed below in connection with FIGS. 1, 8, and 9.

Notched-chirp generator 20 contains a first chirp generator 28 and a second chirp generator 30. Second chirp generator 30 is substantially identical in form to first chirp generator 28. First chirp generator 28 includes a first summing element 32 that sums three input phase terms, each of which is a function of time t, to produce a first chirp phase signal $\phi_{C0}$. The three input phase terms are a first initial chirp phase term $\phi_0$, a first initial chirp term $2\pi f_0 t$, and a first chirp acceleration term $\pi k_0 t^2$.

First initial phase term $\phi_0$ determines initial phase $\phi_0$ of first chirp phase signal $\phi_{C0}$, hence of notched-chirp signal 24, at a chirp start time $t_0$. Term $\phi_0$ is a $t^0$ (unity) function of time.

First initial chirp term $2\pi f_0 t$ determines a start frequency $f_0$ of notched-chirp signal 24 at chirp start time $t_0$. Term $2\pi f_0 t$ is a $t^1$ (linear) function of time.

First chirp acceleration term $\pi k_0 t^2$ determines quadratic change of phase $\phi$ of first chirp phase signal $\phi_{C0}$, hence of notched-chirp signal 24. Term $\pi k_0 t^2$ is a $t^2$ (quadratic) function of time. Therefore, phase $\phi$ of chirp phase signal $\phi_{C0}$ exhibits a quadratic progression 34 over time and frequency f exhibits a linear progression 36 over time, from chirp start time $t_0$ to a chirp end time $t_E$.

A chirp duration $t_D$ is equal to chirp end time $t_E$ less chirp start time $t_0$. The overall phase change of chirp phase signal $\phi_{C0}$ is $2\pi f_0(t_E-t_0)+\pi k_0(t_E^2-t_0^2)$, and can be seen to have both linear and quadratic components.

Similarly, second chirp generator 30 includes a second summing element 38 that sums a second initial chirp phase term $\phi_1$, a second initial chirp term $2\pi f_1 t$, and a second chirp acceleration term $\pi k_1 t^2$ to produce a second chirp phase signal $\phi_{C1}$.

Those skilled in the art will recognize that the form utilized for chirp generators 28 and 30 is but one of many forms of chirp generators feasible utilizing conventional technologies. The chirp-generator form is irrelevant to the operation of the present invention.

In the preferred embodiment, second input terms $\phi_1$, $2\pi f_1 t$, and $\pi k_1 t^2$ are essentially identical to first input terms $\phi_0$, $2\pi f_0 t$, and $\pi k_0 t^2$. This results in second chirp phase signal $\phi_{C1}$ being essentially identical to first chirp phase signal $\phi_{C0}$. Those skilled in the art will appreciate that in some applications second chirp phase signal $\phi_{C1}$ may be first chirp phase signal $\phi_{C0}$. In such a case, both first and second chirp phase signals $\phi_{C0}$ and $\phi_{C1}$ may be generated by first chirp generator 28, thus eliminating the need for second chirp generator 30. In other circumstances, for reasons discussed below, it remains desirable for second chirp phase signal $\phi_{C1}$ to be separately generated by second chirp generator 30.

Second chirp phase signal $\phi_{C1}$ is converted into antichirp signal $A_1$ by a functional conversion element 40 and an antichirp generator 42. Functional conversion element 40 converts second chirp phase signal $\phi_{C1}$ into an oscillating antichirp signal $A_{O1}$, which is passed to antichirp generator 42 (the signal passing through and processed by antichirp generator 42 is an antichirp signal by definition). In the preferred embodiment, functional conversion element 40 is a cosine element for which second chirp phase signal $\phi_{C1}$ defines the argument of a cosine function. Oscillating antichirp signal $A_{O1}$, is therefore essentially identical to an in-phase component $I_N$ of notched-chirp signal 24 without notches 26. Those skilled in the art will appreciate that functional conversion element 40 may be other than a cosine element and that oscillating antichirp signal $A_{O1}$, may be other than the in-phase component of a quadrature chirp signal without reducing or altering the functionality of the present invention.

Notched-chirp generator 20 utilizes antichirp generator 42 to convert oscillating antichirp signal $A_{O1}$, into antichirp signal $A_1$. Antichirp generator 42 contains three elements, a scaling element 44, a weighting element 46, and a shifting element 48, each of which modifies oscillating antichirp signal $A_{O1}$ in a different manner.

In scaling element 44, a scaling multiplier 50 multiplies oscillating antichirp signal $A_{O1}$ by a scaling signal $S_1$. The product of this multiplication is scaled antichirp signal $A_{S1}$ (see FIG. 3). Scaled antichirp signal $A_{S1}$ is similar in appearance to oscillating antichirp signal $A_{O1}$ (not shown), varying only in magnitude. In FIG. 3, the vertical axis represents the phase of scaled antichirp signal $A_{S1}$ in radians. Scaling element 44 greatly reduces phase excursions 52 (i.e. variations in signal phase from a norm) of oscillating antichirp signal $A_{O1}$. Oscillating antichirp signal $A_{O1}$, being the output of a cosine function, varies between +1 and −1. In the preferred embodiment, scaled antichirp signal $A_{S1}$ represents phase excursions 52 of less than ±0.02 radians.

FIGS. 3, 4, and 5 illustrate the linearly changing frequencies of antichirp signals $A_{O1}$, $A_{S1}$, and $A_{W1}$, respectively. It should be noted that these frequencies are highly exaggerated, as independent phase excursions 52 would not otherwise be visible in the scale of the Figures.

In weighting element 46, a weighting multiplier 54 multiplies oscillating antichirp signal $A_{O1}$ (scaled antichirp signal $A_{S1}$ in the preferred embodiment of FIG. 1) by a weighting function $W_1$. The product of this multiplication is weighted antichirp signal $A_{W1}$ (see FIG. 4), in which the magnitude of phase excursions 52 is shaped to conform to a weighting envelope 56.

Weighting envelope 56 may be any of a class of envelope shapes extending over an envelope cycle 58 having a length coincident with chirp duration $t_D$, i.e. weighting envelope 56 is a function of first chirp phase signal $\phi_{C0}$ with regards to time t, as is resultant antichirp signal $A_1$. The magnitude of weighting envelope 56, hence the magnitude of phase excursions 52, has a maximum excursion during cycle 58 between a cycle start time $t_{YS}$ and a cycle end time $t_{YE}$. Prior to cyclical positioning (to be discussed), cycle start time $t_{YS}$ and cycle end time $t_{YE}$ are coincident with chirp start time $t_0$ and chirp end time $t_E$. Maximum excursion is attained at a time $t_N$ between chirp start time $t_0$ and chirp end time $t_E$.

In the preferred embodiment, weighting function $W_1$ is a cosine function, giving weighting envelope 56 a semi-sinusoidal shape (see FIG. 4), with an amplitude of zero at cycle start time $t_{YS}$ and cycle end time $t_{YE}$, and a maximum value at time $t_N$ midway between cycle start time $t_{YS}$ and cycle end time $t_{YE}$. This form of weighting function $W_1$ produces a deep, narrow, pointed-bottom shape for notch 26. Such notch shape is generally suitable for preventing interference with single-frequency signals.

Other weighting functions $W_1$ produce weighting envelopes 56 with other shapes, which in turn give other shapes to notches 26. A sinx/x weighting function $W_1$, for example, produces a wider, flat-bottomed shape for notch 26. Such a notch shape may be suitable for preventing interference with wider bandwidth signals or clusters of single-frequency signals.

Those skilled in the art will appreciate that many non-discontinuous functions may be used for weighting function $W_1$. Other weighting functions $W_1$ give other shapes to weighting envelopes 56 and produce other shapes for notches 26. A given notch shape may be optimal for a specific application.

Additionally, semi-sinusoidal weighting envelope 56 shown in the preferred embodiment is symmetrical. This symmetry, echoing the inherent symmetry of cosine weighting function $W_1$, places maximum-excursion time $t_N$ midway between cycle start time $t_{YS}$ and cycle end time $t_{YE}$. An asymmetrical weighting function $W_1$ would produce an asymmetrical shape for weighting envelope 56 and could also position maximum-excursion time $t_N$ asymmetrically between cycle start time $t_{YS}$ and cycle end time $t_{YE}$. Such asymmetry may be an advantage under certain circumstances.

In shifting element 48, a cyclical shifter 60 shifts oscillating antichirp signal $A_{O1}$ (weighted antichirp signal $A_{W1}$ in the preferred embodiment) by a shift offset time $t_1$ (see FIG. 5). Shift offset time $t_1$ may be considered to be an offset from chirp start time $t_0$ configured so as to cyclically-position envelope cycle 58 within chirp duration $t_D$, thus producing antichirp signal $A_1$ (see FIG. 5). Shifting envelope cycle 58 causes cycle start time $t_{YS}$ and cycle end time $t_{YE}$ to be positioned at shift offset time $t_1$, later in time than chirp start time $t_0$. It follows, then, that maximum-excursion time $t_N$ is also shifted within chirp duration $t_D$.

Those skilled in the art will appreciate that the order of scaling element 44, weighting element 46, and shifting element 48 is irrelevant to the operation of antichirp generator 42. Appropriate compensation may be necessary in specific element orders. For example, if shifting element 48 is placed ahead of weighting element 46, then weighting function $W_1$ would also be shifted accordingly prior to multiplication.

As seen in FIG. 1, first chirp phase signal $\phi_{C0}$ is passed to modulator and translator 62. A summing element 63 sums, i.e. modulates, first chirp phase signal $\phi_{C0}$ with antichirp signal $A_1$ within a modulating element 64 to produce notched-chirp phase signal $\phi_N$. Notched-chirp phase signal $\phi_N$ is then translated into notched-chirp signal 24 by a conventional quadrature converter 66. In the preferred embodiment, converter 66 is represented as an in-phase (cosine) converter 68 producing in-phase component $I_N$, and a quadrature (sine) converter 70 producing a quadrature component $Q_N$. Those skilled in the art will appreciate that other converters may be used to translate notched-chirp phase signal $\phi_N$ into notched-chirp signal 24.

First chirp phase signal $\phi_{C0}$ exists in the phase domain (see FIG. 2). It essentially provides an argument to a cosine/sine transformation having first initial chirp phase $\phi_0$ at chirp start time $t_0$, changing at a rate determined by first chirp term $2\pi f_0 t$ and first chirp acceleration term $\pi k_0 t^2$, and achieving an end phase $\phi_E$ at chirp end time $t_E$. The overall range of phase change of first chirp phase signal $\phi_{C0}$ normally is in excess of 10,000 radians.

Antichirp signal $A_1$ may also exist in the phase domain. It essentially provides an argument to a cosine/sine transformation having second initial chirp phase $\phi_1$ at cycle start time $t_{YO}$, having a frequency of phase excursions 52 which change at a rate determined by second chirp acceleration term $\pi k_1 t^2$, and achieving an end phase at cycle end time $t_{YE}$. Unlike first chirp phase signal $\phi_{C0}$, antichirp signal $A_1$ is cosine transformed by functional conversion element 40 and then scaled, weighted, and cyclically shifted by antichirp generator 42. This results in a cosine/sine transform argument whose phase excursions 52 are several orders of magnitude smaller than that of first chirp phase signal $\phi_{C0}$, typically less than ±0.02 radians, and whose frequency varies linearly over time. Additionally, antichirp signal $A_1$ varies in the magnitude of phase excursions 52 in a manner determined by weighting function $W_1$, with phase excursions 52 being maximum at a time $t_N$ relative to chirp start time $t_0$ and determined by shift offset time $t_1$.

In the preferred embodiment, the modulation of first chirp phase signal $\phi_{C0}$ by antichirp signal $A_1$ produces notched-chirp phase signal $\phi_N$. Notched-chirp phase signal $\phi_N$ is essentially a phase-domain argument of a cosine/sine transform having an overall phase change identical to that of first chirp phase signal $\phi_{C0}$, but with that overall phase change perturbed in a minuscule manner by phase excursions 52 of antichirp signal $A_1$. This is depicted in FIG. 2 by the small section of notched-chirp phase signal $\phi_N$ enlarged in the inset circle to show phase perturbations/excursions 52 of the overall phase excursion.

Translating element 66 effectively translates notched-chirp phase signal $\phi_N$ from the phase domain into notched-chirp signal 24 in the time domain (see FIGS. 2 and 6). Notched-chirp signal 24 linearly increases in frequency f over time t, being lowest at chirp start frequency $f_0$ at chirp start time $t_0$ and highest at a chirp end frequency $f_E$ at chirp end time $t_E$. Because of phase perturbations 52 upon the overall quadratic phase progression 34 of notched-chirp phase signal $\phi_N$, notched-chirp signal 24 has a notch 26 at a notch frequency $f_N$ corresponding to maximum-excursion time $t_N$ of antichirp signal $A_1$.

Referring to FIGS. 1 and 6, the width, depth, and position of notch 26 is adjustable by varying certain input parameters. The position of notch 26 is a function of shift offset time $t_1$. That is, varying shift offset time $t_1$ varies maximum-excursion time $t_N$ (FIG. 5) of antichirp signal $A_1$, and hence varies the position of notch frequency $f_N$ within notched-chirp signal 24.

The width of notch 26 is a function of weighting function $W_1$. That is, varying or selecting weighting function $W_1$ varies the shape of weighting envelope 56 of antichirp signal $A_1$, and hence varies the width of notch 26 within notched-chirp signal 24.

The depth of notch 26 is a function of scaling signal $S_1$. That is, varying scaling signal $S_1$ varies the magnitude of phase excursions 52 at maximum-excursion time $t_N$ of antichirp signal $A_1$, and hence varies the depth of notch frequency $f_N$ within notched-chirp signal 24.

To a lesser degree, the depth of notch 26 is also a function of second initial phase term $\phi_1$. That is, varying second initial phase term $\phi_1$ varies the instantaneous phase of antichirp signal $A_1$ at maximum-excursion time $t_N$, and may be used to "fine tune" the depth of notch 26. Under normal circumstances, notch 26 is of more than sufficient depth without adjusting second initial phase term $\phi_1$. In this case, second initial phase term $\phi_1$ is substantially identical to first initial phase term $\phi_0$ and, as previously discussed, second chirp phase signal $\phi_{C1}$ may be first chirp phase signal $\phi_{C0}$ and second chirp phase generator 30 may be omitted. Those skilled in the art will appreciate, however, that conditions may occur where such fine tuning is desirable, especially when many notches 26 are to be included in notched-chirp signal 24. Under such conditions, an independent first chirp generator 28 in conjunction with separate second chirp generators 30 for each antichirp signal $A_1$ may be desirable.

As previously stated, phase perturbations 52 are several orders of magnitude smaller than the overall range of phase change of notched-chirp phase signal $\phi_N$. Phase perturbations 52 are sufficiently smaller than the overall range of phase change that in a diagram of any reasonable scale, phase perturbations 52 would appear to be at most a slight noise or jitter of notched-chirp phase signal $\phi_N$. This smallness can be appreciated by the reverse-engineering of notched-chirp signal 24. That is, notched-chirp signal 24 is simulated with a notch 26 having the desired depth, width, and shape. Simulated notched-chirp signal 24 is then transformed using an inverse Fourier transform into notched-chirp phase signal $\phi_N$. An idealized first chirp phase signal $\phi_{C0}$ is then subtracted from notched-chirp phase signal $\phi_N$, with the subtracted signal filtered to remove modulo-$2\pi$ artifacts. The remainder, which in the same scale appears as noise, is antichirp signal $A_1$. Antichirp signal $A_1$ may then be magnified and analyzed to determine the required scale, phase shift, weighting function, and cyclical rotation.

Figure 7:
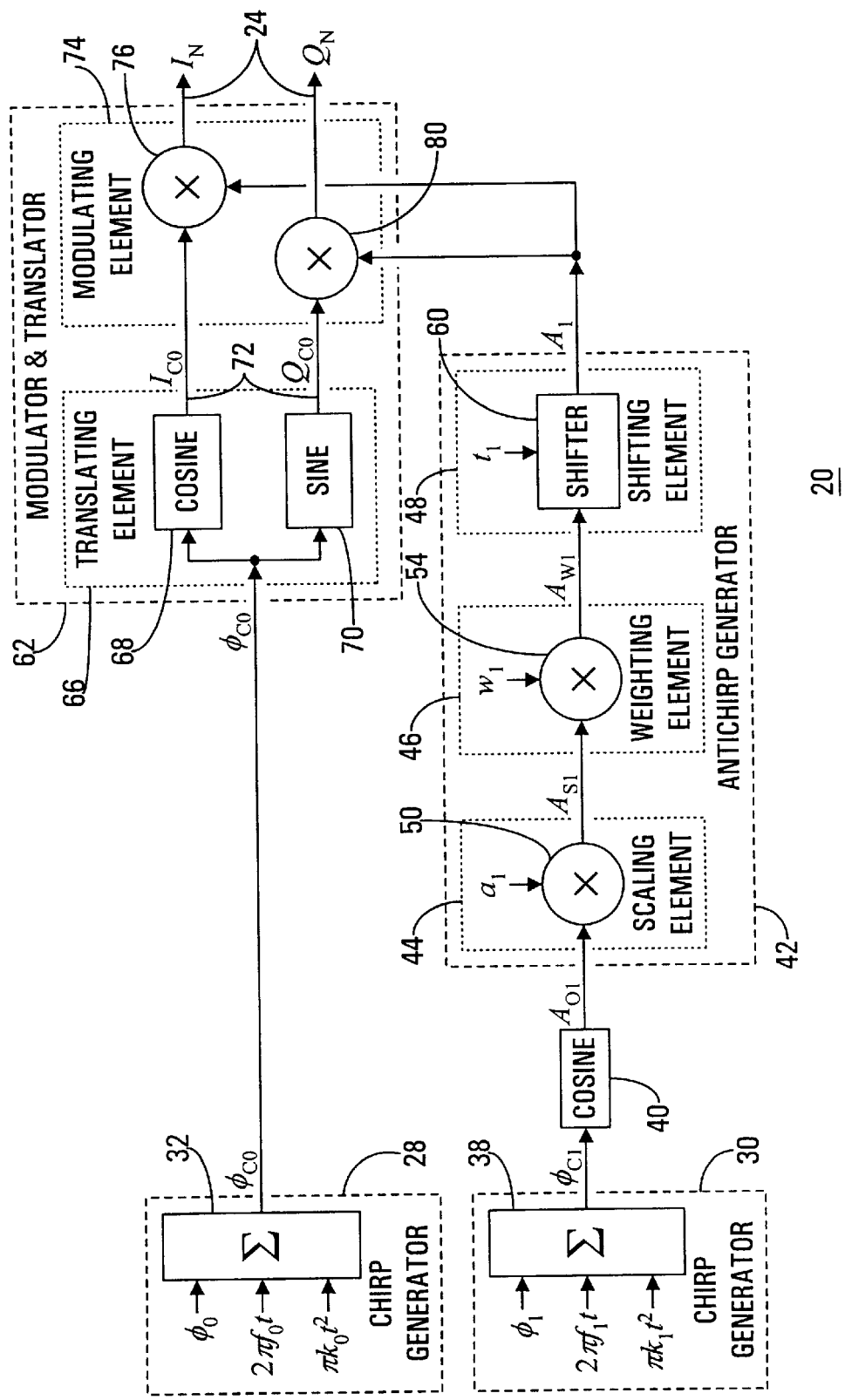
FIG. 7 depicts a block diagram of a notched-chirp generator utilizing an antichirp signal in the amplitude domain in accordance with an alternate embodiment of the present invention.

FIG. 7 depicts a block diagram of notched-chirp generator 20 utilizing antichirp signal $A_1$ in the amplitude domain in accordance with an alternate embodiment of the present invention. The following discussion refers to FIG. 7.

In an alternate embodiment, notched-chirp generator 20 contains first chirp generator 28 producing first chirp phase signal $\phi_{C0}$, and second chirp generator 30 producing second chirp phase signal $\phi_{C1}$. First chirp phase signal $\phi_{C0}$ is fed directly into translation element 66 where it is converted into a chirp signal 72 having an in-phase component $I_{C0}$ and a quadrature component $Q_{C0}$.

Second chirp phase signal $\phi_{C1}$ is converted into antichirp signal $A_1$ by functional conversion element 40 and antichirp generator 42 in a manner substantially identical to that described in conjunction with FIGS. 1 through 6.

Antichirp signal $A_1$ are in this case taken to be in the amplitude domain. Chirp signal 72 and antichirp signal $A_1$ are fed into an amplitude-modulating element 74. Within amplitude-modulating element 74, an in-phase modulator 76 amplitude modulates in-phase component $I_{C0}$ of chirp signal 72 to produce an in-phase component $I_N$ of an amplitude-modulated notched-chirp signal 78. Similarly, a quadrature modulating element 80 amplitude modulates quadrature component $Q_{C0}$ of chirp signal 72 to produce a quadrature component $Q_N$ of amplitude-modulated notched-chirp signal 78.

Those skilled in the art will readily perceive that the form and method of modulation and translation is independent of the scope and premise of the present invention.

Figure 8:
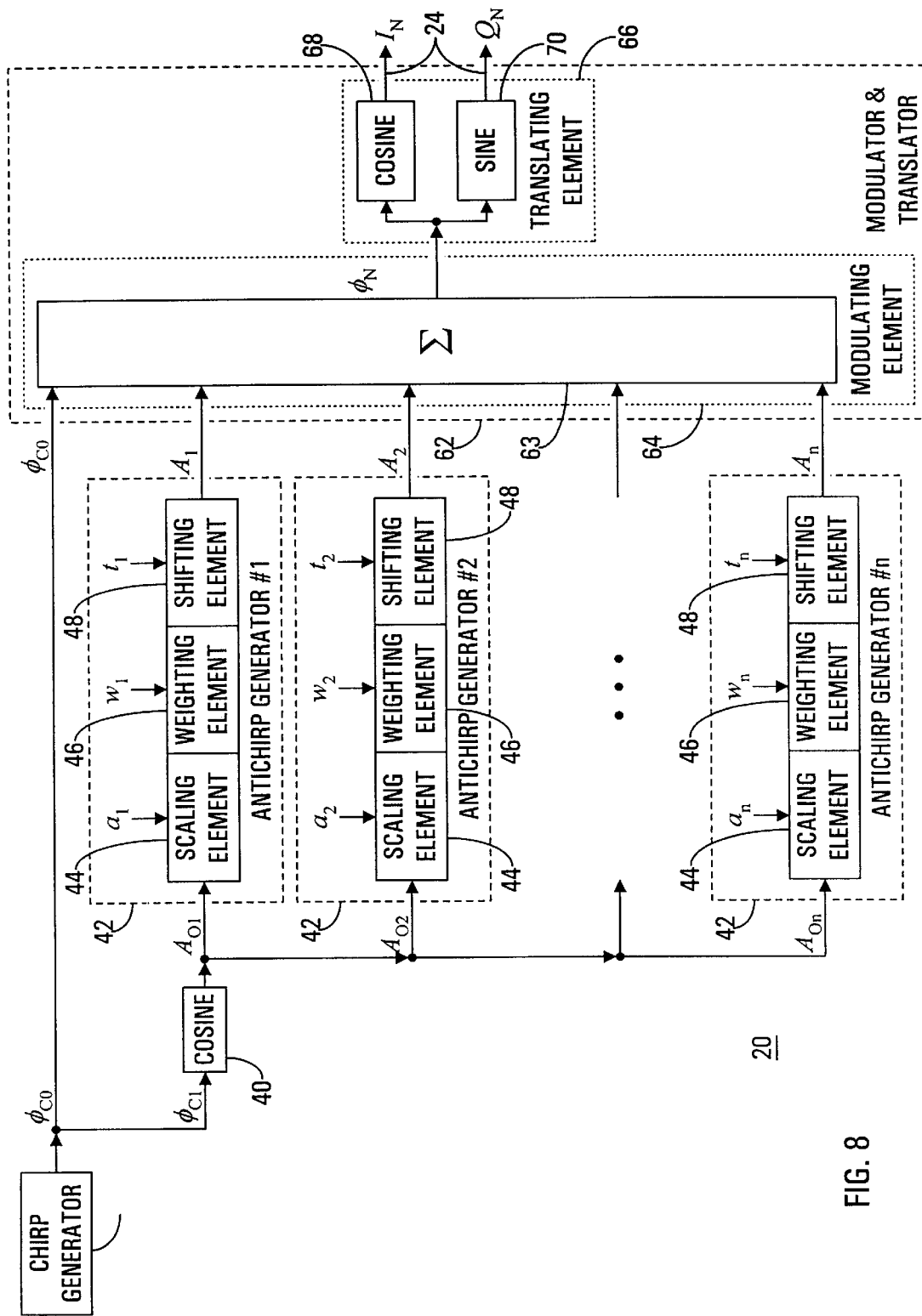
FIG. 8 depicts a block diagram of a notched-chirp generator configured to produce multiple notches in accordance with a preferred embodiment of the present invention.

FIG. 8 depicts a block diagram of notched-chirp generator 20 configured to produce multiple notches 26, and FIG. 9 depicts a frequency spectrum 22 of a notched-chirp signal 24 having multiple notches 26, in accordance with a preferred embodiment of the present invention. The following discussion refers to FIGS. 1, 8, and 9, and presumes a preferred embodiment having a plurality of notches 26 within notched-chirp signal 24.

FIG. 6 shows one chirp generator 28 producing first and second chirp phase signals $\phi_{C0}$ and $\phi_{C1}$. Where connected to modulator and translator 62, the output of chirp generator 28 constitutes first chirp phase signal $\phi_{C0}$. Where connected to functional conversion element 40, the output of chirp generator 28 constitutes second chirp phase signal $\phi_{C1}$. Second chirp phase signal $\phi_{C1}$ is translated by functional conversion 40 into oscillating antichirp signals $A_{O1} \ldots A_{On}$ which are then coupled to each of a plurality of antichirp generators 42.

Those skilled in the art will appreciate that separate chirp phase generators 28 may be used for first chirp phase signal $\phi_{C0}$ and each of a plurality of "second" chirp phase signals $\phi_{C1} \ldots \phi_{Cn}$. Each second chirp phase signal $\phi_{C1} \ldots \phi_{Cn}$ may then be translated by one of a plurality of cyclical translators 40 into one of a plurality of oscillating antichirp signals $A_{O1} \ldots A_{On}$ for each antichirp generator 42. Each antichirp generator 42 is substantially identical to each other antichirp generator 42, varying only in scaling signals $S_1 \ldots S_n$, weighting functions $W_1 \ldots W_n$, and shift offset times $t_1 \ldots t_n$, so as to produce different notches 26 within notched-chirp signal 24.

Each antichirp generator 42 generates one of a plurality of antichirp signals $A_1 \ldots A_n$. Within modulator and translator 62, first chirp phase signal $\phi_{C0}$ is then modulated by, i.e. summed with, all antichirp signals $A_1 \ldots A_n$ by summer 63 within modulating element 64 to produce notched-chirp phase signal $\phi_N$. Notched-chirp phase signal $\phi_N$ is then converted by translating element 66 into notched-chirp signal 24. Notched-chirp signal 24 contains one notch 26 for each antichirp generator 42 (five example notches 26 are shown in FIG. 9).

In summary, the present invention provides a method and a means for the propagation of notched-chirp signal 24 for use by synthetic-aperture radar and other applications over frequencies incorporating fixed-frequency emergency, navigational, and other signals. It does so by generating notches 26 in notched-chirp signal 24 coincident with those fixed-frequency signals. The depth, width, and position of notches 26 are conformable to meet the desired non-interference criteria while maintaining integrity and efficiency of notched-chirp signal 24.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A method for generating a notched-chirp signal, said method comprising the steps of:

generating a chirp phase signal which progresses quadratically over time;

generating an antichirp signal as a function of said chirp phase signal;

modulating said chirp phase signal by said antichirp signal; and translating said chirp phase signal into said notched-chirp signal.

2. A method as claimed in claim 1 wherein:

said modulating step modulates said chirp phase signal by said antichirp signal to produce a notched-chirp phase signal; and said translating step translates said notched-chirp phase signal into said notched-chirp signal.

3. A method as claimed in claim 2 wherein said modulating step comprises the step of scaling said antichirp signal so that said chirp phase signal experiences perturbations away from said quadratic progression.

4. A method as claimed in claim 2 wherein said modulating step causes said chirp phase signal to experience excursions of less than 0.04 radians.

5. A method as claimed in claim 2 wherein:

said chirp phase signal has a chirp duration; and said modulating step causes said chirp phase signal to experience excursions which vary in frequency throughout said chirp duration.

6. A method as claimed in claim 5 wherein said modulating step modulates said chirp phase signal with a modulation envelope having an envelope cycle extending over said chirp duration, said modulation envelope having a maximum excursion within said envelope cycle.

7. A method as claimed in claim 6 wherein said excursions vary linearly in frequency throughout said envelope cycle.

8. A method as claimed in claim 6 wherein said modulating step comprises the step of cyclically shifting said envelope cycle relative to said chirp duration.

9. A method as claimed in claim 1 wherein:

said translating step translates said chirp phase signal into a chirp signal; and said modulating step modulates said chirp signal by said antichirp signal to produce said notched-chirp signal.

10. A notched-chirp generator configured to generate a notched-chirp signal and comprising:

a chirp generator configured to generate a chirp phase signal which is a quadratic function of time;

an antichirp generator configured to generate an antichirp signal having excursions which vary in frequency over time; and a modulating element configured to modulate said chirp phase signal by said antichirp signal to produce a notched-chirp signal.

11. A notched-chirp generator as claimed in claim 10 additionally comprising a functional conversion element coupled to said antichirp generator and configured to generate an oscillating signal which varies in frequency over time.

12. A notched-chirp generator as claimed in claim 10 wherein said antichirp generator receives an oscillating signal which varies in frequency over time, and comprises a scaling element configured to scale said oscillating signal.

13. A notched-chirp generator as claimed in claim 10 wherein said antichirp generator receives an oscillating signal which varies in frequency over time, and comprises a weighting element configured to weight said oscillating signal with a weighting function.

14. A notched-chirp generator as claimed in claim 10 wherein said antichirp generator receives an oscillating signal which varies in frequency over time, and comprises a shift element configured to cyclically position said oscillating signal so as to produce a signal notch at a specific frequency within a spectrum of said notched-chirp signal.

15. A notched-chirp generator as claimed in claim 10 wherein said antichirp generator receives an oscillating signal which varies in frequency over time, and comprises:

a scaling element configured to scale said oscillating signal;

a weighting element configured to weight said oscillating signal; and a shift element configured to cyclically position said oscillating signal so as to produce a signal notch at a specific frequency within said notched-chirp signal.

16. A notched-chirp generator as claimed in claim 10 wherein:

said chirp generator is a first chirp generator; and said notched-chirp generator additionally comprises a second chirp generator, said second chirp generator being coupled to said antichirp generator.

17. A notched-chirp generator as claimed in claim 10 wherein:

said antichirp generator is one of a plurality of antichirp generators;

said antichirp signal is one of a plurality of antichirp signals, each of said antichirp signals being generated by a different one of said plurality of antichirp generators and being configured to produce a signal notch at a different frequency within a spectrum of said notched-chirp signal; and said modulating element is configured to modulate said chirp phase signal and each of said plurality of antichirp signals to produce said notched-chirp phase signal.

18. A notched-chirp generator as claimed in claim 10 additionally comprising means for translating said notched-chirp phase signal into said notched-chirp signal.

19. A method for the generation of a notched-chirp radar transmission signal wherein said method comprises the steps of:

producing first and second chirp phase signals;

converting said second chirp phase signal into an oscillating signal;

generating an antichirp signal from said oscillating signal;

modulating said first chirp phase signal by said antichirp signal to produce a notched-chirp phase signal; and translating said notched-chirp phase signal to produce said notched-chirp signal.

20. A method as claimed in claim 19 wherein said generating step comprises the step of multiplying said oscillating signal by a scaling signal.

21. A method as claimed in claim 20 wherein said generating step comprises the step of multiplying said oscillating signal by a weighting function.

22. A method as claimed in claim 21 wherein said generating step comprises the step of cyclically positioning said oscillating signal to produce said antichirp signal.

23. A method as claimed in claim 19 wherein:

said method additionally comprises the step of repeating said generating step to generate a plurality of antichirp signals, each of which is configured to produce a signal notch at a different frequency within said notched-chirp signal; and said modulating step sums said plurality of antichirp signals and said first chirp phase signal to produce said notched-chirp phase signal.

* * * * *